(12) United States Patent
Ko

(10) Patent No.: US 6,913,995 B2
(45) Date of Patent: Jul. 5, 2005

(54) METHOD OF FORMING A BARRIER METAL IN A SEMICONDUCTOR DEVICE

(75) Inventor: Chang Jin Ko, Ichon-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/618,988

(22) Filed: Jul. 14, 2003

(65) Prior Publication Data

US 2004/0127020 A1 Jul. 1, 2004

(30) Foreign Application Priority Data

Dec. 26, 2002 (KR) .................................. 10-2002-0084338

(51) Int. Cl.$^7$ .......................................... H01L 21/4763
(52) U.S. Cl. ........................ 438/643; 438/637; 438/672; 438/674; 438/687
(58) Field of Search ................................ 438/637, 687, 438/672, 674

(56) References Cited

U.S. PATENT DOCUMENTS

| | | | |
|---|---|---|---|
| 6,017,811 A | 1/2000 | Winton et al. | |
| 6,265,321 B1 | 7/2001 | Chooi et al. ................. | 438/725 |
| 6,309,957 B1 | 10/2001 | Tu et al. ...................... | 438/622 |
| 6,323,121 B1 | 11/2001 | Liu et al. ..................... | 438/633 |
| 6,413,879 B1 * | 7/2002 | Maeda ......................... | 438/758 |
| 6,537,896 B1 | 3/2003 | Catabay et al. ............. | 438/474 |
| 6,566,260 B2 * | 5/2003 | Gupta et al. ................. | 438/687 |
| 6,645,864 B1 * | 11/2003 | Lin et al. ..................... | 438/692 |

OTHER PUBLICATIONS

Official Action, Korean Intellectual Property Office, issued in connection with Korean Patent Application Serial No. 2002–84338, dated Sep. 21, 2004, 2 pages.

* cited by examiner

*Primary Examiner*—B. William Baumeister
*Assistant Examiner*—Renee R. Berry
(74) *Attorney, Agent, or Firm*—Marshall, Gerstein & Borun LLP

(57) ABSTRACT

Disclosed is a method of forming a barrier metal in the semiconductor device. The method comprises the steps of a) patterning a porous film on a base layer to form a via hole, b) depositing a CVD TiN film on the entire structure including the via hole, c) implementing a plasma treatment process using $N_2+H_2$, d) repeatedly implementing the steps (b) and (c) in order to bury only the pores formed on the surface of the porous film with CVD TiN, and e) forming a barrier metal on the entire structure including the via hole. Therefore, the present invention can prevent introduction of the conductive material into the base layer in a subsequent process.

4 Claims, 3 Drawing Sheets

METHOD OF FORMING A BARRIER METAL IN A SEMICONDUCTOR DEVICE

BACKGROUND

1. Field of the Disclosure

A method of forming a barrier metal in a semiconductor device is disclosed that is capable of preventing introduction of a conductive material into a base layer by a subsequent process, by forming the barrier metal after pores existing on the surface of an interlayer insulating film being a porous film are buried.

2. Background of the Related Art

As the degree of integration in the semiconductor device is increased, the distance between the metal lines is narrowed. Accordingly, there is a problem that the speed of the device is reduced since the parasitic capacitance between the metal lines is increased. In order to solve this problem, it is required that copper (Cu), etc. having a low resistivity and a good electrical conductivity be used as a material of the metal line instead of aluminum or tungsten that has been currently used. A low dielectric constant film is needed to be used as the insulating film instead of the existing oxide film having a dielectric constant of 4.

The low dielectric constant film includes an organic polymer film, an inorganic SiOC film and a porous film having porosities therein. Of them, the organic polymer film and the inorganic SiOC film have a dielectric constant of about 2.7, which is relatively high among the low dielectric constant film.

The porous film can improve a low dielectric constant characteristic by controlling the ratio of the pore within the film. This porous material is made by a method by which air bubbles of a small size are formed within the film in the course of curing a precursor of a solid state or a weak coupling between TEOS particles being the precursor, and a solvent is abruptly volatilized to keep the porous structure intact. In this process, silica mesh count within the porous material and the pore structure are changed depending on a drying method of the solvent. If the solvent is volatilized by an annealing process like the curing of the SOG film, a material having a dense structure is formed while the porous material shrunk, so that it does not have a desired characteristic of the porous film having a low dielectric constant. Therefore, the porous material is formed by means of a supercritical drying method of abruptly volatilizing the solvent in a condition of over a triple point in the solvent. Another method includes making precocious the solvent as a special solvent at the normal pressure to form the porous material. As the pore has a dielectric constant of 1 in the air, it is required that the ratio of the pore be increased or the dielectric characteristic of silica be lowered in order to form a film of a low dielectric constant. In case of the former, however, if the ratio of the pore is increased, mechanical stability is lowered since a structural strength of the film is weaken. For this reason, there is a problem that the low dielectric constant film could not hold the weight when a subsequent CMP process, etc. implemented.

A method of manufacturing the semiconductor device using the above porous film will be described by reference to FIG. 1A and FIG. 1B.

Referring to FIG. 1A, a first SiC layer 12, a porous film 13 and a second SiC layer 14 are formed on a base layer 11. A via hole 10 trough which a part of the base layer 11 is exposed is then formed by a patterning process. As described above, a plurality of pores 15 are formed in the porous film 13. In particular, pores 16 are formed at the sidewalls of the via hole 10.

By reference to FIG. 1B, a barrier metal 17 is formed on the entire structure including the via hole 10. At this time, the barrier metal 17 is broken off due to the pores at the sidewalls of the via hole 10, so that a broken-off region 18 is formed. In the porous film, the size of the pore is approximately 10~40 Å and the density of the pore is about 30~50%. Copper is infiltrated into the base layer 11 due to discontinuity of this barrier metal when a subsequent seed metal, copper, etc. buried, which degrades the characteristic of the device.

SUMMARY OF THE DISCLOSURE

Accordingly, a method of forming a barrier metal in a semiconductor device is disclosed that is capable of preventing introduction of a conductive material into a base layer in a subsequent process, by burying pores existing on the surface of an interlayer insulating film being a porous film and then forming the barrier metal.

Additional advantages and features of the disclosed techniques will be set forth in part in the description which follows and in part will become apparent to those having ordinary skill in the art upon examination of the following or may be learned from practice of the invention. The advantages of the disclosed techniques may be realized and attained by the structure particularly pointed out in the written description and claims hereof as well as the appended drawings.

To achieve these advantages, as embodied and broadly described herein, a method of forming a barrier metal in a semiconductor device according to the present invention is characterized in that it comprises a) patterning a porous film on a base layer to form a via hole, b) depositing a CVD TiN film on the entire structure including the via hole, c) implementing a plasma treatment process using $N_2+H_2$, d) repeatedly implementing the steps (b) and (c) in order to bury only the pores formed on the surface of the porous film with CVD TiN, and e) forming a barrier metal on the entire structure including the via hole.

It is to be understood that both the foregoing general description and the following detailed description of the disclosed techniques are exemplary and explanatory and are intended to provide further explanation of the disclosed techniques as claimed.

BRIEF DESCRIPTION OF THE DRAWINGS

The above and other features and advantages of the disclosed methods will be apparent from the following detailed description of the preferred embodiments in conjunction with the accompanying drawings, in which.

DETAILED DESCRIPTION OF THE PREFERRED EMBODIMENT

FIG. 2A through FIG. 2D are cross-sectional views of semiconductor device for explaining a method of forming a barrier metal in the device according to a preferred embodiment of the present invention.

Figure 1A:
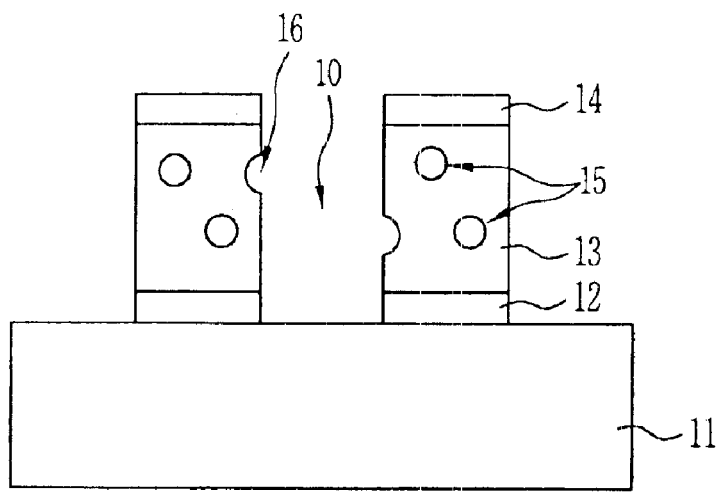
FIGS. 1A and 1B are cross-sectional views of semiconductor device for explaining a conventional method of forming a barrier metal in the device.
Figure 1B:
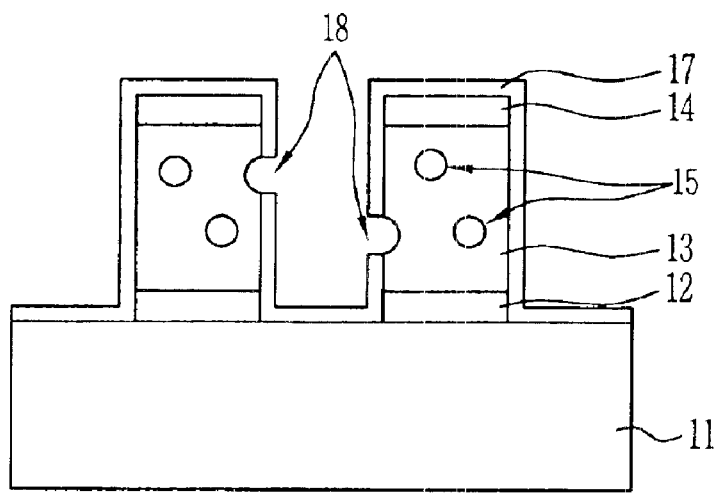
Figure 2A:
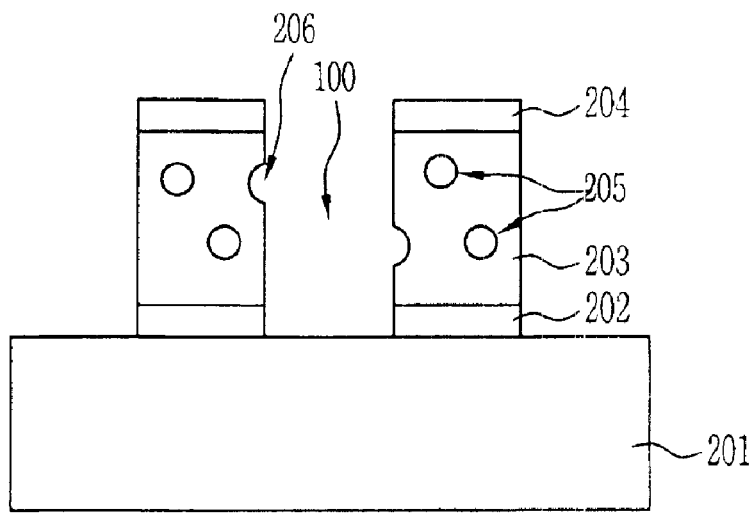
FIG. 2A through FIG. 2D are cross-sectional views of semiconductor device for explaining a disclosed method of forming a barrier metal in the device according to a preferred embodiment.

Referring to FIG. 2A, a first SiC layer 202, a porous film 203 and a second SiC layer 204 are formed on a base layer 201. A via hole 100 trough which a part of the base layer 201 is exposed is then formed by a patterning process. A plurality of pores 205 are formed in the porous film 203. In particular, pores 206 are formed at the sidewalls of the via hole 100.

Figure 2B:
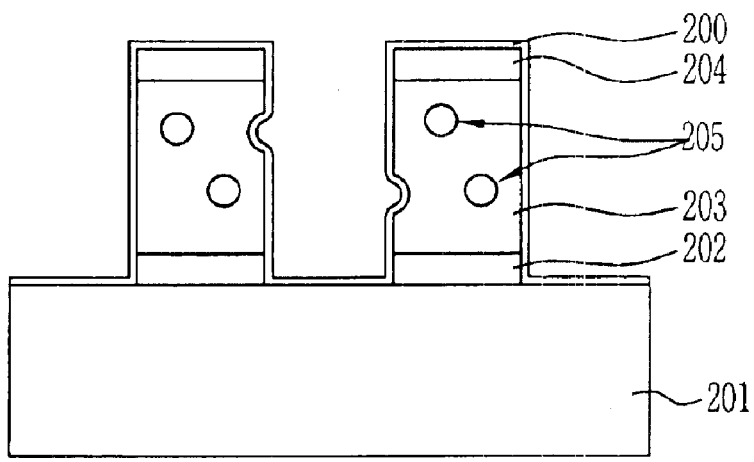

By reference to FIG. 2B, a CVD TiN film 200 is deposited in thickness of 10~20 Å on the entire structure including the via hole 100 using a TDMA source. At this time, the CVD TiN film has a very good step coverage and MOTiN being CVD TiN may be deposited.

Next, a plasma treatment process is implemented using $N_2+H_2$ gas. C, O, S, etc. within the CVD TiN film 200 are coupled with hydrogen by this plasma treatment and are then pumped out. The thickness of the CVD TiN film 200 is also reduced. Accordingly, the pores on the surface of the porous film 203 are gradually buried with CVD TiN.

Figure 2C:
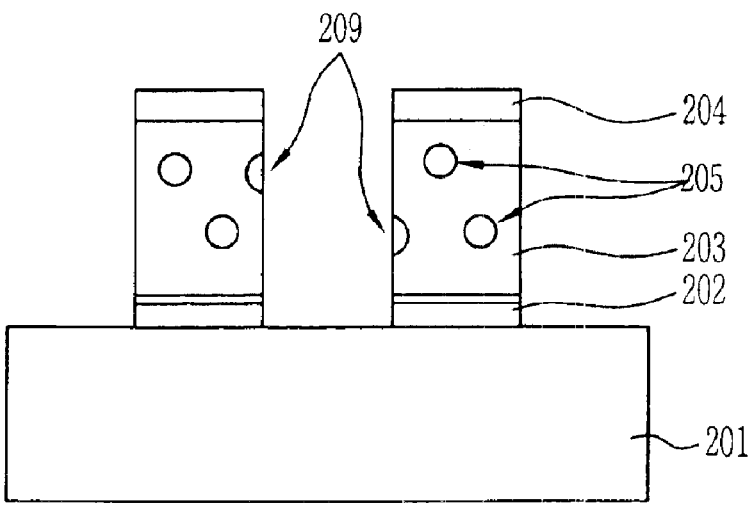

Deposition of CVD TiN and the subsequent plasma treatment are repeatedly implemented so that only the exposed pores 206 (FIG. 2A) on the sidewalls of the via hole 100 are completely buried by adequately controlling the thickness of CVD TiN and a plasma treatment time, as shown by the buried or filled pores 209 in FIG. 2C.

Figure 2D:
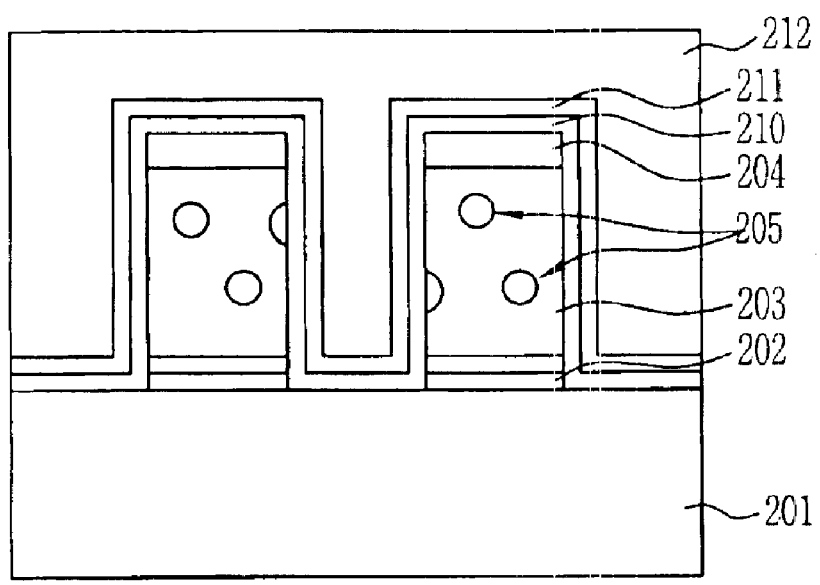

Turning to FIG. 2D, a barrier metal 210 and a seed metal 211 are deposited on the entire structure including the via hole 100. A conductive material 212 such as copper (Cu) is then buried.

As the pores 206 formed on the sidewall surface of the porous film that define the via hole 100 are removed by the above process by creating filled or buried pores 209, the unwanted phenomenon of conductive material being introduced into the underlying structure through the pores 206 is avoided by creating the filled or buried pores 209 thereby acting to block migration of the conductive material into the porous material 203 and later into the base layer 201.

As described above, after the pores 206 existing on the surface of the interlayer insulating film being the porous film 203 are buried to form the structures shown at 209, the barrier metal 210 is formed. Therefore, the disclosed methods have a new effect that it can prevent introduction of the conductive material into the base layer in a subsequent process.

The forgoing embodiments are merely exemplary and are not to be construed as limiting this disclosure. The present teachings can be readily applied to other types of apparatuses. This description is intended to be illustrative, and not to limit the scope of the claims. Many alternatives, modifications, and variations will be apparent to those skilled in the art.

What is claimed is:

1. A method of forming a barrier metal in a semiconductor device, comprising the steps of:
    a) patterning a porous film on a base layer to form a via hole through the porous film to expose at least part of the base film, the porous film comprising exposed pores on an exposed sidewall surface of the porous film;
    b) depositing a thin CVD TiN film on the entire structure including the via hole;
    c) implementing a plasma treatment process using $N_2+H_2$;
    d) repeatedly implementing the steps (b) and (c) in order to bury only the exposed pores formed on the exposed sidewall surface of the porous film with CVD TiN leaving a remaining exposed sidewall surface of the porous film substantially uncovered by CVD TiN; and
    e) forming a barrier metal on the entire structure including the via hole.

2. The method as claimed in claim 1, wherein the CVD TiN film is formed in thickness of 10~20 Å.

3. A method of forming a barrier metal in a semiconductor device, comprising the steps of:
    a) patterning a porous film on a base layer to form a via hole through the porous film to expose at least part of the base film, the via hole being defined by at least one sidewall of the porous film, the sidewall comprising exposed pores;
    b) repeatedly implementing a process of depositing a thin MOTiN film and a plasma treatment process so that exposed pores at the sidewall are buried by one or more MOTiN films leaving a remaining surface area of the sidewall that is free of exposed pores substantially free of MOTiN; and
    c) forming a barrier metal on the entire structure including the via hole.

4. The method as claimed in claim 3, wherein the one or more MOTiN films are formed in a total thickness of 10~20 Å.

* * * * *